United States Patent [19]
Olivo et al.

[11] Patent Number: 5,687,135
[45] Date of Patent: Nov. 11, 1997

[54] COUNT UNIT FOR NONVOLATILE MEMORIES

[75] Inventors: Marco Olivo, Bergamo; Marco Maccarrone, Palestro, both of Italy

[73] Assignee: SGS-Thomson Microelectronics S.r.l., Agrate Brianza, Italy

[21] Appl. No.: 700,126

[22] Filed: Aug. 20, 1996

Related U.S. Application Data

[63] Continuation of Ser. No. 365,155, Dec. 28, 1994, abandoned.

[30] Foreign Application Priority Data

Dec. 28, 1993 [EP] European Pat. Off. .............. 93830527

[51] Int. Cl.⁶ ........................................... G11C 8/00
[52] U.S. Cl. ................................. 365/236; 365/189.12
[58] Field of Search ..................... 365/189.05, 189.12, 365/236; 377/54

[56] References Cited

U.S. PATENT DOCUMENTS

| | | | |
|---|---|---|---|
| 4,509,142 | 4/1985 | Childers | 365/236 |
| 4,592,078 | 5/1986 | Yamada | 377/54 |
| 4,837,748 | 6/1989 | Chung | 365/236 |

FOREIGN PATENT DOCUMENTS

| | | | |
|---|---|---|---|
| 0 376 285 | 7/1990 | European Pat. Off. | G11C 16/06 |
| 2 606 183 | 5/1988 | France | G06F 9/32 |

OTHER PUBLICATIONS

Haywood, "Multiple Counters Using RAMS," *Electronic Engineering* 51(622):35, 1979.

Heuer et al., "Shared Adder Yields High Performance/Low Circuit Count Counter," *IBM Technical Disclosure Bulletin* 20(7) 1977.

*Primary Examiner*—A. Zarabian
*Attorney, Agent, or Firm*—David V. Carlson; Seed and Berry LLP

[57] ABSTRACT

A count unit for performing a number of count operations and wherein, instead of a counter for each count function, provision is made for one counter and a number of registers equal in number to the count functions involved. The registers store the preceding count value and, when their content is to be incremented or in any way altered, load it into the counter which provides for performing the required operation, at the end of which, the content of the counter is stored in the respective register. One of the registers presents a second parallel input for externally loading an initial data which may be transferred to the other registers via the counter.

24 Claims, 2 Drawing Sheets

COUNT UNIT FOR NONVOLATILE MEMORIES

CROSS-REFERENCE TO RELATED APPLICATION

This application is a continuation of U.S. patent application Ser. No. 08/365,155, filed Dec. 28, 1994, now abandoned.

TECHNICAL FIELD

The present invention relates to a count unit for nonvolatile memories, in particular flash-EPROMs.

BACKGROUND OF THE INVENTION

As is known, flash type nonvolatile memories involve a particularly complex erasure procedure: firstly, the entire memory must be preprogrammed to "0", then actually erased and possibly also any incorrectly erased cells are checked and adjusted.

To perform these operations, flash type memories contain a sequencer implemented by a state machine and connected to a signal interpreter. The operations to be performed involve various count operations which, to avoid an excessive increase in the number of states or complexity of the state machine, cannot be performed directly by the sequencer. For this purpose, the memory features an oscillator which supplies a time base for both the count operations and rendering the control logic fully synchronous.

By way of example, the count functions typically present in a flash memory of the type described are:

a) scanning of the address of all the memory locations for programming and/or content checking after each modification pulse;

b) duration of programming and erase pulses, and slow signal stabilizing delay times (not controllable using straightforward analog delays);

c) number of programming and/or erase attempts made for each request from the signal interpreter: the specification of this type of memory always provides for a maximum modification time after which an external error flag must be supplied;

d) scanning various voltages at which to set the circuit of cells for adjustment, which may be achieved by decoding the outputs of a counter which thus controls a variable-voltage source.

At present, each of the above functions is performed using a separate binary or polynomial counter.

Though widely adopted, such an approach involves considerable expenditure in terms of layout for forming the counters, and, what is more, in terms of test time, by virtue of all the counters having to be tested singly, preferably by scanning all the possible configurations involved.

SUMMARY OF THE INVENTION

It is an object of the present invention to provide a count unit designed to overcome the aforementioned drawbacks.

According to the present invention, there are provided a count unit for nonvolatile memories as claimed in claim 1, and a count method as claimed in claim 12.

In practice, according to the present invention, instead of providing a counter for each count function, if simultaneous performance is not required, provision is made for one counter and a number of registers equal to the number of functions involved. The registers store the preceding count value and, whenever they are to be incremented or in any way altered, load the content into the counter which provides for performing the operation in question. Subsequently, the content of the counter is restored in the respective register, so that the counter may be used for a further count function.

BRIEF DESCRIPTION OF THE DRAWINGS

A non-limiting embodiment of the present invention will be described by way of example with reference to the accompanying drawings, in which.

DETAILED DESCRIPTION OF THE INVENTION

Figure 1:
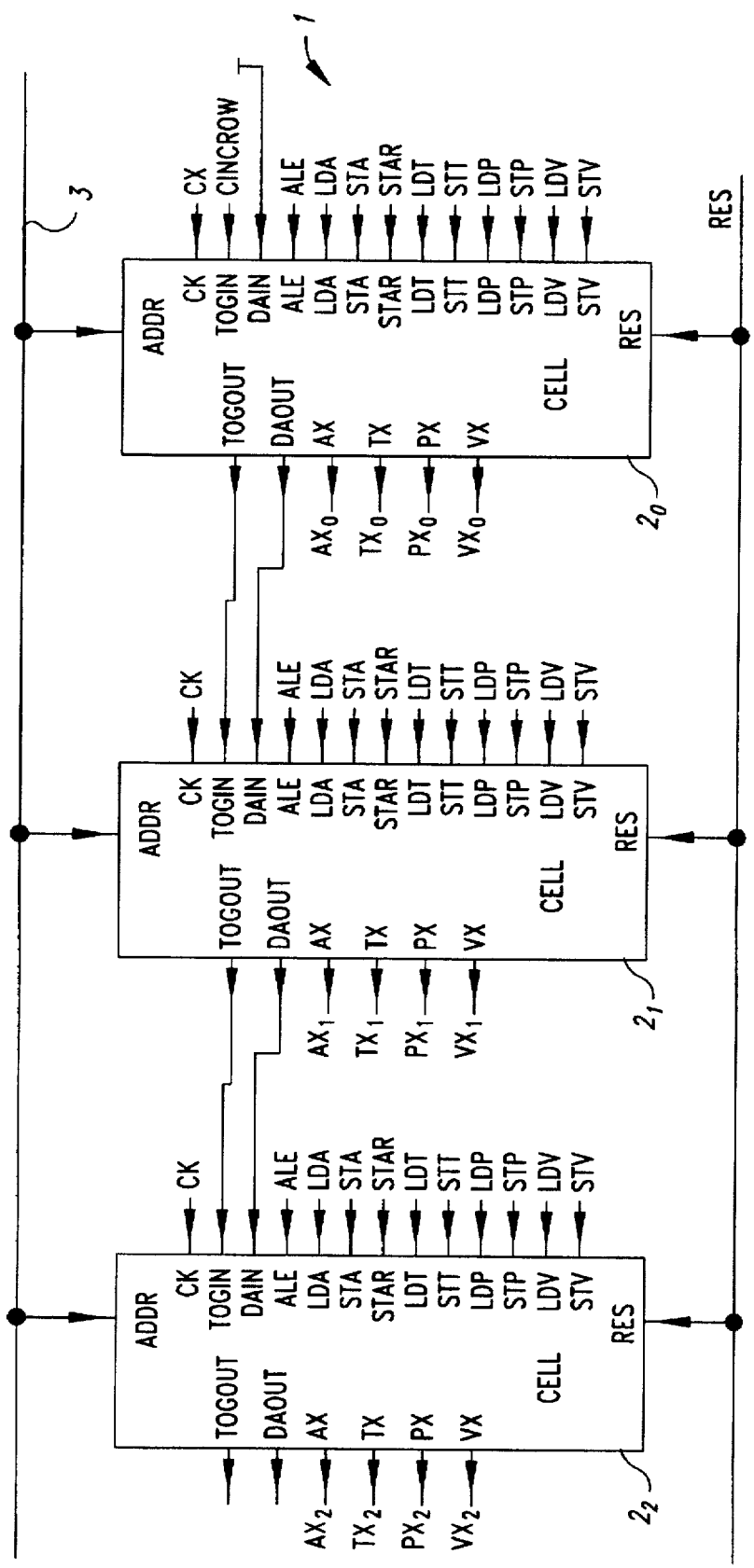
FIG. 1 shows a block diagram of the unit according to the present invention.

FIG. 1 shows part of an N-bit count unit implementing four count functions and indicated as a whole by 1.

As the cells all present the same structure and are provided according to the maximum number of bits of the count functions, FIG. 1 shows only three cells $2_0$, $2_1$, $2_2$ of unit 1, each corresponding to one bit. In the example shown, unit 1 performs four count functions, indicated SV, ST, SP, SA in FIG. 3, but may implement any number of count functions by providing an appropriate number of individual cell components, as explained later on.

As shown in FIG. 1, each cell $2_i$, where i=0 ... 2, presents a number of input/output terminals at which is present a corresponding number of signals referred to generally by the same name as the corresponding terminal, with the exception of those indicated below.

More specifically, each cell $2_i$ presents an external data (initialization) input ADDR connected to an external bus 3; a CK input supplied with a clock signal; a TOGIN input explained later on; a carry bit input DAIN; inputs ALE, LDA, STA, STAR, LDT, STT, LDP, STP, LDV, STV supplied with signals of the same name as explained later on; a reset input RES; data outputs $AX_i$, $TX_i$, $PX_i$, $VX_i$; a carry bit output DAOUT; and a carry signal output TOGOUT.

The TOGIN input of cell $2_0$ is supplied with a CINCROW signal for incrementing a given count content, as explained later on; while the TOGOUT output of each cell $2_i$ is connected to the TOGIN input of a higher-order cell $2_{i+1}$. Similarly, the DAIN input of cell $2_0$ is connected to a reference potential line $V_{DD}$, and the DAOUT output of each cell $2_i$ is connected to the DAIN input of a higher-order cell $2_{i+1}$.

In general, each cell also comprises further inputs and/or outputs, e.g., for supplying signals inverted in relation to those shown, or for other functions extraneous to the present invention and therefore not shown.

Figure 2:
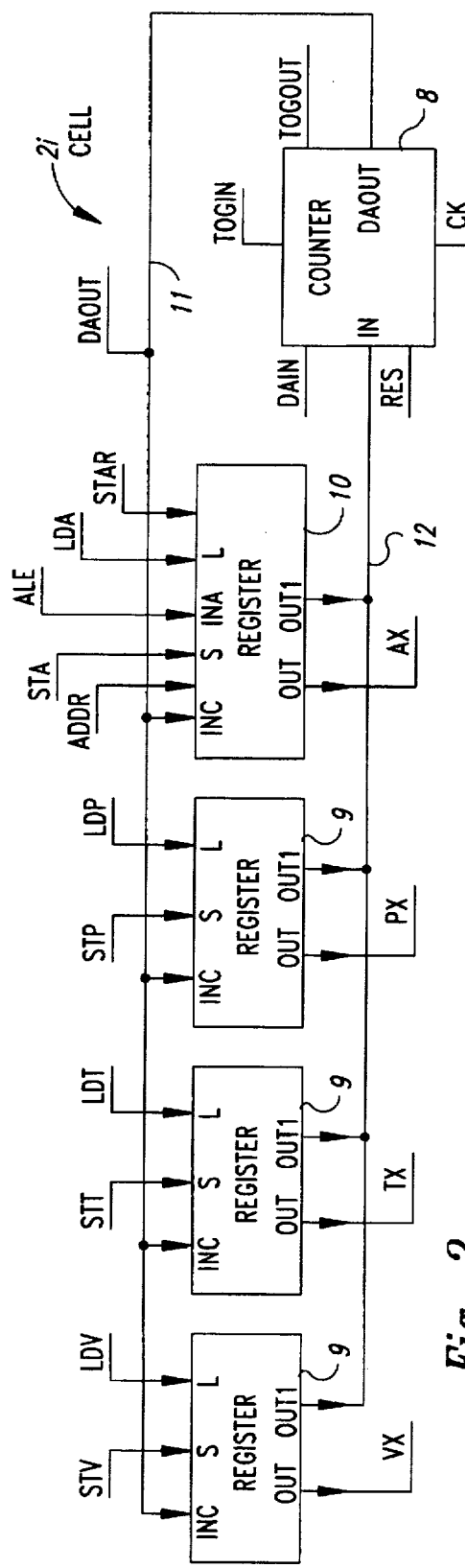
FIG. 2 shows a detail of FIG. 1.

FIG. 2 shows the structure of a generic cell $2_i$ in the case of a count unit according to the present invention implementing four count functions as indicated.

As shown in FIG. 2, each cell $2_i$ comprises a counter element 8, and four register elements, all relative to one bit. Of the four register elements, three, indicated by 9, are identical, while the fourth, indicated by 10, is more complex and provides for externally loading an initial configuration. Register elements 9, 10 are parallel connected to a data (bit) input line 11 and a data (bit) output line 12. More specifically, each register element 9, 10 presents an input INC connected to line 11, and an output OUT1 connected to line 12. Lines 11, 12 are connected respectively to the DAOUT output and IN input of counter element 8, and represent local buses.

Register elements 9, 10 each present two inputs L and S supplied with specific load and store signals LDA, STA, LDP, STP, LDT, STT, LDV, STV; and an output OUT at which the stored bit is supplied—signal AX, PX, TX, VX.

Register element 10 also comprises a further three inputs ADDR, ALE, STAR which are supplied with corresponding data and signals for externally loading an initial bit (one for each cell). More specifically, ADDR specifies the bit to be loaded; ALE controls storage of the external bit; and STAR controls a switch (not shown) for holding the data (in the absence of storage instructions from the counter or externally).

Counter element 8 presents the DAIN, RES, CK and TOGIN inputs already described with reference to FIG. 1; an IN input connected to line 12; a DAOUT output connected to line 11 (and the higher-order cells, as shown in FIG. 1); and a TOGOUT output connected to the higher-order cells (FIG. 1).

The internal structure of register elements 9, 10 and counter element 8 may be designed in various ways and, not being the object of the present invention, is therefore not shown in detail. Typically, register elements 9 may be composed of known D-latch circuits, and register element 10 substantially in the same way, but with the addition of the INA input controlled by the ALE signal.

Counter element 8 forms part of a binary counter which may be in the form of a ripple or advance carry counter or any other type of counter, and which represents an arithmetical-logic unit (ALU) with a minimum operation set including incrementation of the stored value (TOGIN 1), reset (RES 0) and no operation (TOGIN=0).

Figure 3:
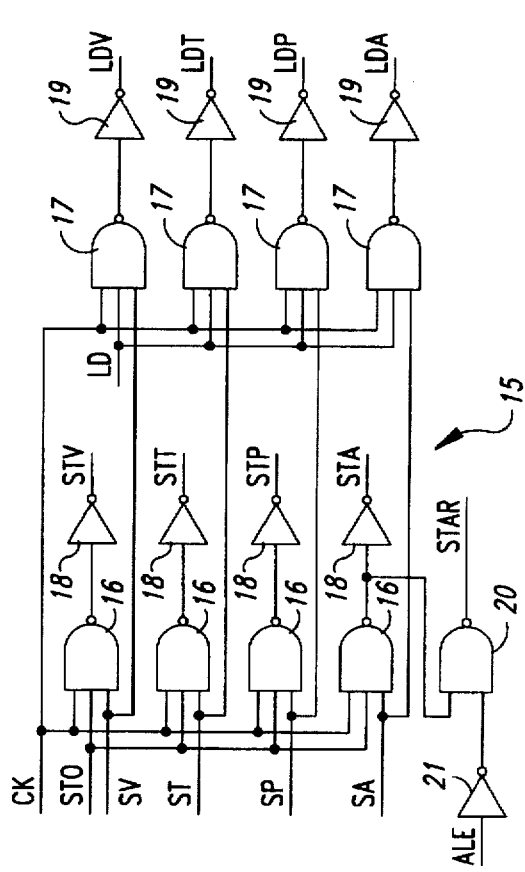
FIG. 3 shows a diagram of the circuit by which the single control steps of the FIG. 1 blocks are generated.

The steps relative to each register are conveniently generated from general load and store instructions and address signals, e.g., by means of a logic circuit of the type shown in FIG. 3.

In FIG. 3, the control circuit by which the control steps of register elements 9, 10 are generated is indicated as a whole by 15, and comprises a number of NAND circuits 16 with three inputs supplied respectively with clock signal CK, a register store signal STO, and one of four address signals (SA for register element 10, and SP, ST and SV for each of register elements 9); and a further number of NAND circuits 17 with three inputs supplied respectively with clock signal CK, counter load signal LD, and one of address signals SA, SP, ST and SV. The output of each NAND circuit 16, 17 is connected to an inverter 18, 19, the output of which presents a respective control signal for each register, which is supplied to all the cells $2_i$ in FIG. 1. Circuit 15 also comprises a further NAND circuit 20, one input of which is connected to the output of the NAND circuit 16 generating the inverse of signal STA, and the other input of which is connected to the output of an inverter 21 supplied with external load signal ALE. The circuits 16 may be referred to as storage-signal generator means, and the circuits 17 may be referred to as load-signal generating means. Furthermore, the control circuit 15, the inputs CK, TOGIN, DAIN, and RES of the counter element 8, and the ADDR input to the register element 10 together form a control means. The inputs to the counter element 8 form an operating signal input means.

The count unit described above operates as follows.

The register to be altered is specified externally by generating a sequence such as LD-CINCROW (or RES)-STO and the address SA, SP, ST or SV of the register in question. As a result, the data contained in the relative register element 9, 10 of all of cells $2_i$ is loaded into respective counter element 8 over line 12; and the respective bit is incremented (possibly repeatedly throughout the time available) or erased, and back-stored in the same register element over line 11.

For externally loading a data into a given register, register element 10 is employed, for which purpose, the ALE signal is supplied externally, and the data over line 3. In this way, the single bits of the data are loaded into register elements 10 and possibly transferred, by means of load signal LDA, to respective counters 8 where they may be modified using the available operators (increment and reset) and finally re-transferred by means of storage signal STA, STP, STT, STV to the respective register.

The advantages of the unit according to the present invention are the following. Firstly, it provides for a reduction in the number of components used, in direct proportion to the number of count functions involved. In fact, a counter always requires master-slave control of its registers, whereas a simple storage register may be a D-latch type if loading may be carried out on one level and does not require loading at a switching edge of the clock signal. Consequently, considering that, in CMOS technology, a master-slave circuit requires two D-latch circuits, M binary counters of N bits require M*2*N D-latch cells (plus the carry generating logics). According to the present invention, on the other hand, the same number of count functions require 2*N counters and M*N registers, i.e., a total of 2*N+M*N=N (M+2) which, for M>2, means a saving in the number of latches required. Moreover, both the incrementing and reset operations require additional circuitry (carry propagating and reset logics) which in this case are provided only once on the counter.

As the various count functions may not require the same number of counter bits, cells $2_i$ containing varying numbers of register elements 9 may be constructed so as to form a structure with as many cells as the bits in the longest count function. In this case, the lower-order cells (equal in number to the bits in the shortest count function) will contain all the registers, while those of increasingly higher order will contain increasingly fewer registers, thus enabling optimization of the overall size of the count function.

Checking or testing the count functions is simplified greatly by being limited to only one binary counter per cell; and may be further simplified by the possibility of loading counters 8 of unit 1 with a random or specific configuration with which to check the performance of the counters in particular situations, e.g., when the carry is generated. This provides for a drastic reduction in test time by eliminating the need to perform $2^N$ incrementing steps (corresponding to $2^N$ stroke of the clock) to test operation of an N-order counter.

Moreover, the buses between each counter element 8 and respective register elements 9, 10 are local, and the carry is propagated between adjacent cells $2_i$, thus reducing the layout requirement for the connecting lines.

Appropriate solutions may be devised for compensating for the greater complexity of the count instructions (which, as opposed to a simple incrementing signal, require a succession of loading, incrementing and re-storage signals). For example, said succession may be generated as a subroutine of the state machine (possibly exploiting the architecture of the machine itself) or with the aid of simple dedicated logics external to the state machine and capable of producing the desired sequence from an enabling signal, which involves very little expenditure in terms of layout. Whichever the case, the availability of the three loading, incrementing and storage signals provides for greatly enhanced testing as described above.

It will be clear that changes may be made to the unit as described and illustrated herein without, however, departing from the scope of the present invention. For example, any suitable type of register may be employed; and the type of counter may also differ, though, in the case of flash type nonvolatile memory applications, it must be a binary and cannot be a polynomial type, by virtue of address scanning requiring an orderly as opposed to pseudo-random progression to conform with certain data programming and check strategies typical of this type of memory. At any rate, even in the event of applications involving other types of memories not requiring the above type of address scanning, any effort to improve layout might be defeated by a nonbinary structure in the case of different count modules involving different feedback logics.

Moreover, the instructions implemented may be so integrated as to take into account the requirements of particular applications, or modified to meet specific requirements. For example, reset signal RES may be replaced by a system of reset signals for selectively resetting the counter so that only some of the counter bits are reset, leaving the others unchanged. This may be useful for example in the case of a flash type memory in which, at present, the address register contains row address bits and others column address bits, the value of some of which also identifies the selected array sector. It is useful therefore to dispose of a selective reset for the row or column identification bits, and for the row and column bits not identifying the sector.

We claim:

1. A memory circuit, comprising:
   an array of nonvolatile memory cells;
   an address circuit coupled to said array; and
   control logic coupled to said address circuit, said control logic including a count unit for performing a predetermined number of count functions related to operation of said nonvolatile memory cells; said count unit including:
   a plurality of registers equal in number to said predetermined number of count functions;
   a shared counter;
   means for connecting said registers to said shared counter; and
   control means, connected to said registers and said shared counter, for transferring data stored in a selected one of said registers to said shared counter to be updated by said shared counter according to a predetermined count function, and for transferring updated data from said shared counter to one of said registers.

2. A memory circuit as claimed in claim 1 wherein each of said registers comprises at least a first data input, and a first data output; and said connecting means comprise a first connecting line interposed between an output of said shared counter and said first data input of said registers; and a second connecting line interposed between said first data output of said registers and an input of said shared counter.

3. A memory circuit as claimed in claim 1 wherein each said register comprises a first and second control input; and said control means comprise load generating means connected to said first control input of said registers for generating a selective load signal; operating signal input means connected to said shared counter; and storage generating means connected to said second control input of said registers for generating a selective storage signal.

4. A memory circuit as claimed in claim 3 wherein said operating signal input means comprise a first input element for an incrementing signal, and a second input element for a reset signal.

5. A memory circuit as claimed in claim 3 wherein said load generating means comprise a first number of logic circuits equal in number to said predetermined number of count functions and connected to a load control line and to address lines; and said storage generating means comprise a second number of logic circuits equal in number to said predetermined number of count functions and connected to a storage control line and to said address lines.

6. A memory circuit as claimed in claim 1 wherein at least one of said registers comprises a second data input and a third control input for receiving external initializing data.

7. A memory circuit as claimed in claim 6 wherein said control means comprise initializing generating means connected to said at least one register for generating a parallel storage signal.

8. A memory circuit as claimed in claim 1 wherein each of said registers comprises a second data output connected to output terminals of said count unit.

9. A memory circuit as claimed in claim 1 wherein each of said registers forms a D-latch register.

10. A memory circuit as claimed in claim 1 wherein said shared counter is a binary counter.

11. A memory circuit as claimed in claim 1 wherein said count unit comprises a number of cells of given rank, cascade connected to one another, and each relative to a data portion of different rank.

12. In a memory circuit having an array of nonvolatile memory cells, an address register coupled to said array, and control logic coupled to said address register, a count method for performing a predetermined number of count functions related to operation of said nonvolatile memory cells by means of a plurality of registers equal in number to said predetermined number of count functions, and by means of a shared counter, the method comprising the steps of:
   loading data stored in a selected one of said registers into said shared counter;
   updating the data loaded into said shared counter; and
   transferring the updated data from said shared counter to one of said registers.

13. A memory circuit, comprising:
   an array of nonvolatile memory cells;
   an address circuit in communication with said array; and
   control logic in communication with said address circuit, said control logic including a counter unit for performing a number of count functions related to operation of said nonvolatile memory cells, said counter unit comprising:
   a plurality of registers each associated with a respective one of said count functions and each operable to store a count value;
   a shared counter in communication with each of said plurality of registers and operable to update said count values; and
   a controller in communication with said registers and operable to instruct a selected one of said registers to provide said count value stored therein to said shared counter and to transfer an updated count value from said shared counter to one of said registers.

14. The memory circuit of claim 13 wherein said controller is operable to receive a control signal that selects one of said registers.

wherein said controller is operable to generate for said selected register a store signal for a store operation and a load signal for a load operation, and wherein said selected register is operable to store said updated count value from said shared counter in response to said store signal and operable to provide said stored count value to said shared counter in response to said load signal.

15. The memory circuit of claim 13 wherein one of said registers comprises:

an external input operable to receive said count value and a selection input operable to receive a selection signal; and wherein said one of said registers is operable to store the received count value in response to said selection signal.

16. A memory device, comprising:

an array of nonvolatile memory cells;

an address circuit in communication with said array; and control logic in communication with said address circuit, said control logic including a count unit operable to perform a number of count functions related to operation of said nonvolatile memory cells, said count unit including:

a plurality of registers equal in number to said number of count functions, each operable to store a count value, a shared counter in communication with said registers and operable to update said count values stored in said registers, and a controller in communication with said registers and operable to instruct each register to provide said corresponding count value stored therein to said shared counter and to store an updated count value updated by said shared counter.

17. The memory device of claim 16 wherein said controller is operable to receive a control signal that selects one of said registers, wherein said controller is operable to generate for said selected register a store signal for a store operation and a load signal for a load operation, and wherein said selected register is operable to store said updated count value from said shared counter in response to said store signal and operable to provide said count value to said shared counter in response to said load signal.

18. The memory device of claim 16 wherein at least one of said registers comprises:

an external input operable to receive said count value and a selection input operable to receive a selection signal; and wherein said one of said registers is operable to store the received count value in response to said selection signal.

19. In a memory circuit having an array of nonvolatile memory cells, an address register coupled to said array, and control logic coupled to said address register, said control logic including a plurality of registers, a method for performing a number of count functions related to operation of said nonvolatile memory cells, said method comprising:

storing in said registers said number of count values that each correspond to one of said number of said count functions;

loading said count value from a selected one of said registers into a shared counter;

updating the loaded count value with said shared counter according to a corresponding one of said number of said count functions; and storing the updated count value in said selected register.

20. The method of claim 19, further comprising:

receiving a control signal that identifies said selected register and an operation to be performed thereby;

generating a load signal that indicates a load operation;

providing said count value stored in said identified register to said shared counter in response to said load signal;

generating a store signal that indicates a store operation; and storing said updated count value in said identified register in response to said store signal.

21. The method of claim 19, further comprising:

receiving with another one of said registers via external terminals one of said count values and a selection signal; and storing the received count value in said another register in response to said selection signal.

22. The memory circuit of claim 1 wherein said count unit includes a plurality of count sub-units connected to each other, each count sub-unit including:

a plurality of sub-registers each associated with a corresponding one of said registers;

a shared sub-counter operable to update a portion of a selected one of said registers; and wherein one sub-register from each count sub-unit together define said corresponding one of said registers and said shared sub-counter from each count sub-unit together define said shared counter.

23. The memory circuit of claim 13 wherein said counter unit includes a plurality of count sub-units connected to each other, each count sub-unit including:

a plurality of sub-registers each associated with a corresponding one of said registers;

a shared sub-counter operable to update a portion of a selected one of said registers; and wherein one sub-register from each count sub-unit together define said corresponding one of said registers and said shared sub-counter from each count sub-unit together define said shared counter.

24. The memory circuit of claim 16 wherein said control logic includes a plurality of count units connected to each other, each count unit including:

a plurality of sub-registers each associated with a corresponding one of said registers;

a shared sub-counter operable to update a portion of a selected one of said registers; and wherein one sub-register from each count unit together define said corresponding one of said registers and said shared sub-counter from each count unit together define said shared counter.

* * * * *